United States Patent
Tischler et al.

(10) Patent No.: US 8,153,536 B2
(45) Date of Patent: Apr. 10, 2012

(54) TRANSFER OF HIGH TEMPERATURE WAFERS

(75) Inventors: Michael Albert Tischler, Phoenix, AZ (US); Ronald Thomas Bertram, Jr., Mesa, AZ (US)

(73) Assignee: Soitec, Bernin (FR)

( * ) Notice: Subject to any disclaimer, the term of this patent is extended or adjusted under 35 U.S.C. 154(b) by 172 days.

(21) Appl. No.: 12/678,466

(22) PCT Filed: Nov. 12, 2008

(86) PCT No.: PCT/US2008/083201
§ 371 (c)(1),
(2), (4) Date: Mar. 16, 2010

(87) PCT Pub. No.: WO2009/067364
PCT Pub. Date: May 28, 2009

(65) Prior Publication Data
US 2010/0216316 A1    Aug. 26, 2010

Related U.S. Application Data

(60) Provisional application No. 60/989,272, filed on Nov. 20, 2007.

(51) Int. Cl.
*H01L 21/469* (2006.01)
(52) U.S. Cl. ........ 438/767; 118/724; 118/727; 118/728; 118/729; 118/732; 257/E21.154; 257/E21.155; 257/E21.156; 257/E21.211
(58) Field of Classification Search .................. None
See application file for complete search history.

(56) References Cited

U.S. PATENT DOCUMENTS

| | | | | |
|---|---|---|---|---|
| 5,080,549 A | * | 1/1992 | Goodwin et al. | 414/744.8 |
| 5,659,188 A | | 8/1997 | Kao et al. | 257/190 |
| 6,001,175 A | | 12/1999 | Maruyama et al. | 117/102 |
| 6,214,116 B1 | | 4/2001 | Shin | 118/640 |

(Continued)

FOREIGN PATENT DOCUMENTS

DE    100 38 887 A1    2/2002

(Continued)

OTHER PUBLICATIONS

Written Opinion of the International Searching Authority and International Search Report, PCT/US2008/083201, mailed Feb. 18, 2009.

(Continued)

*Primary Examiner* — Charles Garber
*Assistant Examiner* — Yasser Abdelaziez
(74) *Attorney, Agent, or Firm* — Winston & Strawn LLP

(57) ABSTRACT

This invention provides apparatus, protocols, and methods that permit wafers to be loaded and unloaded in a gas-phase epitaxial growth chamber at high temperatures. Specifically, this invention provides a device for moving wafers or substrates that can bath a substrate being moved in active gases that are optionally temperature controlled. The active gases can act to limit or prevent sublimation or decomposition of the wafer surface, and can be temperature controlled to limit or prevent thermal damage. Thereby, previously-necessary temperature ramping of growth chambers can be reduced or eliminated leading to improvement in wafer throughput and system efficiency.

20 Claims, 4 Drawing Sheets

U.S. PATENT DOCUMENTS

| | | | |
|---|---|---|---|
| 6,242,718 B1 * | 6/2001 | Ferro et al. | 219/405 |
| 6,613,685 B1 | 9/2003 | Granneman et al. | 438/710 |
| 2002/0125212 A1 | 9/2002 | Mertens et al. | 216/57 |
| 2006/0237740 A1 * | 10/2006 | Bousquet et al. | 257/103 |
| 2007/0200377 A1 | 8/2007 | Nishio | 294/64.1 |

FOREIGN PATENT DOCUMENTS

| | | |
|---|---|---|
| EP | 1 685 930 A1 | 8/2006 |
| JP | 2005-340552 A | 12/2005 |

OTHER PUBLICATIONS

Mastro, M.A. et al., "Influence of Polarity on GaN Thermal Stability", Journal of Crystal Growth, vol. 274, pp. 38-46 (2005).

Takizawa, T.et al., "Maskless Lateral Epitaxial Growth of Gallium Nitride Using Dimethylhydrazine as a Nitrogen Precursor", Journal of Electronic Materials, vol. 36, No. 4, pp. 403-408 (2007).

Office Action issued in Chinese Application No. 200880116791.7 dated Aug. 1, 2011, and English translation.

\* cited by examiner

TRANSFER OF HIGH TEMPERATURE WAFERS

This application is a 371 filing of International Patent Application PCT/US2008/083201 filed Nov. 12, 2008, which claims the benefit of U.S. application No. 60/989,272 filed Nov. 20, 2007.

FIELD OF THE INVENTION

The present invention is related to the field of semiconductor processing equipment, and specifically provides apparatus and methods that permit a gas-phase epitaxial growth chamber to be loaded and unloaded at high temperatures heretofore unachievable. Specifically, this invention provides a device for moving wafers or substrates that can bathe a substrate being moved in active gases that are optionally temperature controlled.

BACKGROUND OF THE INVENTION

Above known critical temperatures, surfaces of compound semiconductors can be impaired or damaged by, for example, evaporation of one or more of the more volatile species from the surface. One form of this evaporation point is known as "sublimation", in particular "congruent sublimation". For example, in the case of gallium nitride, the onset of surface decomposition, primarily by loss of nitrogen, begins above a temperature of the order of 800° C., see Mastro et al., 2005, J. of Crystal Growth 274:38. One method to preserve the surface and prevent decomposition involves heating such substrates in an ambient containing an adequate supply of the constituent species that are more prone to evaporate from the surface of the compound material. Therefore, GaN surfaces should therefore be maintained in an environment having active nitrogen species (e.g. $NH_3$) at temperatures of the order of 800° C. or above. Also, in the case of gallium arsenide, surface decomposition begins above approximately 640° C. (see U.S. Pat. No. 5,659,188); therefore well in advance of a reaching such a decomposition temperature (typically above 400-450° C.), GaAs should be maintained in an ambient containing arsine.

High throughput reactors, such as the ASM Epsilon®, utilize a Bernoulli wand to load and unload wafers from a transfer chamber into a high temperature reactor. The Bernoulli wand is disclosed in U.S. Pat. No. 5,080,549 and is appropriate for the transfer of high temperature materials as the use of such wands minimizes physical contact between itself and the wafer. The Bernoulli wand (so called after the Bernoulli Principle) utilizes a plurality of gas jets positioned above the wafer to generate a pressure differential between the surface and underside of the wafer. The pressure immediately above the wafer is reduced, in comparison to the underside, and the subsequent pressure differential produces an upward force on the wafer. Advantageously as the wafer is lifted it also experiences a downward force from the gas outlets of the wand. Therefore, an equilibrium position is attained in which the wafer "floats", neither in contact with the ground or the surface of the Bernoulli wand. (Collectively, these and related forces are referred to herein as "aerodynamic forces".)

The utilization of a Bernoulli wand for wafer transfer is known. However, heretofore, such wands have been first and foremost used for the transfer of silicon wafers, which are incapable of undergoing a congruent sublimation type of decomposition and are therefore subject to less rigorous reactor transfer protocols. Conversely, compound semiconductor wafers, which are subject to such damage, commonly require highly controlled heating and cooling procedures to ensure the wafer temperature is below the congruent sublimation temperature prior to loading/unloading of the wafer to or from the process reactor. Although the cooling process is invaluable for preserving the high quality surface of the compound semiconductor, the time taken represents a significant loss in production with the subsequent financial consequences.

SUMMARY OF THE INVENTION

The present invention comprises methods and apparatus to limit or prevent surface decomposition or sublimation, congruent or otherwise (collectively, referred to herein as "surface changes" or "surface damage") of planar, compound semiconductor materials (also known herein as "wafers") during their loading and unloading from a process reactor such as a growth chamber at process temperatures (which can be up to 1,000° C. and above). Decomposition or sublimation of a wafer surface can degrade or damage wafer quality, and limiting or preventing such changes is clearly desirable. Loading and unloading at process temperatures are desirable in order to minimize the times for temperature ramp-up and ramp-down during semiconductor processing. These processes thereby can have increased throughput, and process equipment systems can have higher effective utilizations.

In particular, the present invention includes methods and devices for transferring wafers, especially wafers comprising compound semiconductor materials, between different environments in semiconductor process equipment, particularly environments at different ambient temperatures and with different ambient compositions. The methods and devices of the invention therefore provide flows of an active gas (or a combination of active/inactive gases) that act to limit or prevent decomposition of, or sublimation from, the wafer surface during such transfers, or during residence at lower temperatures, or during time required for temperature ramp-up. For example, it is known that, when compound semiconductor materials are transferred from a higher temperature, growth-promoting ambient (e.g., precursor gases present) to a lower temperature, neutral ambient (e.g., precursor gases absent), surfaces of these materials can decompose (into their precursors or otherwise) or sublime (either congruently or non-congruently). It is also known that this decomposition or sublimation of surface material can be limited or prevented by bathing the surfaces in a gas or gases that favorably alter relevant thermodynamic or kinetic conditions at the surface to favor material formation and disfavor material decomposition. Such gases, known herein as "active gases", are selected in view of the particular compound materials and of the temperature ranges expected, and can include, e.g., gases that themselves act as precursors, or that decompose in the relevant temperature ranges to materials that act as precursors. Generally, active gases are capable of interacting with the compound semiconductor to substantially limit or prevent surface changes during high temperature transfer/residence. On the other hand, "inactive gases" are those gases that do not alter relevant thermodynamic or kinetic conditions at the surface, and can include such "traditional" inert gases as $N_2$, Ar, and the like. Gases that include mixtures of such active gases and of such inactive gases can also be considered herein as "active gases". It should also be noted that the term "wafer" can in certain embodiments not only comprise planar compound semiconductor materials but may also include a carrier wafer used to support a plurality of such compound semiconductor wafers, for example gallium nitride is often grown on a sapphire substrates with diameters of 2-3 inches, in certain embodiment a plurality of such wafers can be loaded into a deposition reactor simultaneous by placing such wafers on a carrier wafer with a sufficiently sized diameter, e.g. a 12 inch diameter quartz wafer. Therefore the term "wafer" is not be limited to a single compound semiconductor but also comprises multiple compound semiconductor wafers on a suitable carrier.

Briefly, the apparatus of the invention includes devices that can control wafers, e.g., can controllably pick-up a wafer from a surface, can controllably suspend a wafer, can controllably move a suspended wafer, and can controllably place a suspended wafer on a surface. Such apparatus can use known forces, e.g., mechanical forces, aerodynamic forces, electromagnetic forces, and the like, for suspending wafers, and the apparatus can be moved by known manual or robotic means. Components for such wafer control and movement are known in the art and are only briefly described herein.

However, apparatus of this invention also comprises components for bathing a wafer surface with active gases, e.g., connections to sources of active gases (and optionally also to sources of inactive gases), conduits for conducting active gases to the vicinity of a suspended wafer, and ports or other mechanisms for discharging the active gas so that the discharged gases bathe the wafer surface. The present invention also provides methods limiting surface changes during high temperature wafer transfer. These methods include selecting active gases (or combinations of active and inactive gases), suitable to a particular semiconductor material (especially, a compound semiconductor material) in particular temperature ranges, providing selected active gases during high-temperature transfer at pressures and flow rates so that surface change is limited or prevented. Optionally, the methods and apparatus can include elements to heat selected gases.

In preferred embodiments, the apparatus is capable of controlling wafers without physically contacting the controlled wafers. In more preferred embodiments, the apparatus includes a Bernoulli wand. Such wands control wafers using aerodynamic forces, and therefore already include at least one conduit for conducting gas and a plurality of ports for discharging gas across the surface of a controlled wafer. See, e.g., U.S. Pat. No. 5,659,188. The gases used to generate the required aerodynamic forces have previously been inert or inactive, e.g., $N_2$ or $H_2$.

However, to limit or prevent surface changes during high temperature transfer, this invention uses gas streams comprising active gas components to generate the wafer-controlling aerodynamic forces. The concentration of the active gas components is chosen in view of the composition of the wafer surface and of the expected transfer temperatures. The gas streams can also comprise selected inert or inactive components depending on the designated growth in the reactor and may include the addition of carrier species to improve process flexibility. Consequently, active gas ejection from the Bernoulli wand fixture of the invention enables wafer loading and unloading without surface deterioration while above temperatures at which surface deterioration (decomposition temperatures or congruent or non-congruent sublimation temperatures) of the specific compound semiconductor is likely.

Further, the invention provides various embodiments of semiconductor wafer transfer devices that can advantageously be utilized in combination with semiconductor processing equipment having a growth chamber for gas-phase epitaxial growth. A wafer transfer device of this invention includes a support member with at least one gas inlet port for receiving one or more gases from one or more external gas sources, a plurality of gas outlet ports for discharging the gases, and at least one passageway for conducting the gases from the inlet port to the outlet ports. It is a key feature of this invention that the gases discharged from the transfer device be chemically active with one or more semiconductor materials in such a manner that decomposition or sublimation (including congruent sublimation) of a wafer surface including such semiconductor materials is limited, especially when the wafer is at high temperatures. Optionally, the transfer device can include one or more heating elements sized and arranged to heat gas flowing through the transfer device; and the support member can be configured to have a narrow neck supporting and terminating in an enlarged, planar head having the plurality of outlet ports.

Thus, when such a semiconductor wafer is transferred by a transfer device of this invention discharging such active gases, the wafer surface is protected from degradation even if at high temperatures. Further, aerodynamic forces generated by the discharged gases can act to suspend a wafer beneath the transfer device (particularly, beneath the head of the transfer device). Accordingly, in various embodiments, this invention can also include a wafer transfer device with a semiconductor wafer suspended beneath the device and bathed by active gases that act to protect the wafer from degradation even at high temperatures.

The gases discharged from the wafer can include a chemically active portion and, optionally, a chemically inactive portion. The active portion of the gases can be chemically reactive with the surface material of the suspended wafer either at its ambient temperature or only above a threshold temperature or in the presence of a plasma source. If the wafer surface includes group III nitride semiconductor materials, the active portion can include active nitrogen species or can pyrolytically decompose to include active nitrogen species in the presence of a plasma source or above a threshold temperature that is less than approximately 1000° C. In particular, the active portion can include ammonia, hydrazine, dimethylhydrazine, a compound comprising a hydrazine moiety, phosphine, or arsine.

The member of this invention can be implemented with a Bernoulli wand. In such embodiments, the invention includes a Bernoulli wand through which flows gases at least a portion of which are chemically reactive with one or more semiconductor materials in a manner so as to limit decomposition or sublimation of a surface of a wafer. Preferably, such embodiments further comprise transfer devices discharging active gases and suspending semiconductor wafers that have surfaces protected the active gases.

The invention also provides various embodiments of semiconductor wafer transfer methods that can be advantageously applied to transferring semiconductor wafers between a growth environment, e.g., a CVD reactor chamber, where the wafer resides during periods of epitaxial growth, and a transfer environment, where the wafer resides before, between, or after periods of epitaxial growth. According to the provided methods, during wafer transfer between these two environments, at least one surface of the wafer is bathed with gases having an active portion that is chemically reactive with the wafer surface in a manner so as to limit its decomposition or sublimation. Optionally, the wafer can continue to be bathed in the transfer-to environment for a period of time until there is little risk of surface decomposition or sublimation in the new environment, or the wafer can be bathed for a time in the transfer-from environment in order to prepare for transfer. Preferably, the wafer is suspended during transfer by aerodynamic forces generated by the gases bathing the wafer surface.

The methods preferably include heating the transfer device, and thus the gases flowing through the device and bathing the wafer, in order to, at least to some degree, control the wafer temperature. Since the transfer environment is generally cooler than the growth environment, it is preferable that, after transfer from the growth environment to the transfer environment, the wafer be bathed by the active gases until its temperature is below that at which surface decomposition or sublimation in the absence of the active gases is significant. Also, it is preferable that the temperature of the bathing gases be controlled by heating so that the rate of wafer temperature decrease in the transfer environment is sufficiently low such that significant thermal damage to the wafer is unlikely.

Further, if the wafer is to be transferred back into the hotter growth environment, it is preferable to prepare for such subsequent return transfer by heating the bathing gases so that the wafer temperature is maintained higher than transfer environment temperature but without surface decomposition or sublimation. Preferably, the wafer surface temperatures at the time of transfer-back are sufficiently high so that significant thermal damage to the wafer is unlikely. These methods can be repeated in order to repeatedly transfer a wafer between these two environments.

Since the growth environment is generally warmer than the transfer environment, it is preferable, after transfer from the transfer environment to the growth environment, that the wafer be bathed by the active gases until its temperature is above that at which surface decomposition or sublimation in the growth environment in the absence of the active gases is significant. Also, it is preferable, while in the transfer chamber and prior to transfer into the growth environment, that the wafer be bathed by the active gases that are heated so that its temperature increases towards the temperature of the growth environment.

The bathing gases are preferably heated in a manner such that the rate of wafer temperature increase is such that significant thermal damage to the wafer is unlikely, and further bathing by the heated gases is preferably continued in the growth environment until the wafer temperature is sufficiently high such that significant thermal damage to the wafer is unlikely from exposure to growth environment temperatures.

Further aspects and details and alternate combinations of the elements of this invention will be apparent from the following detailed description and are also within the scope of the present invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1A:
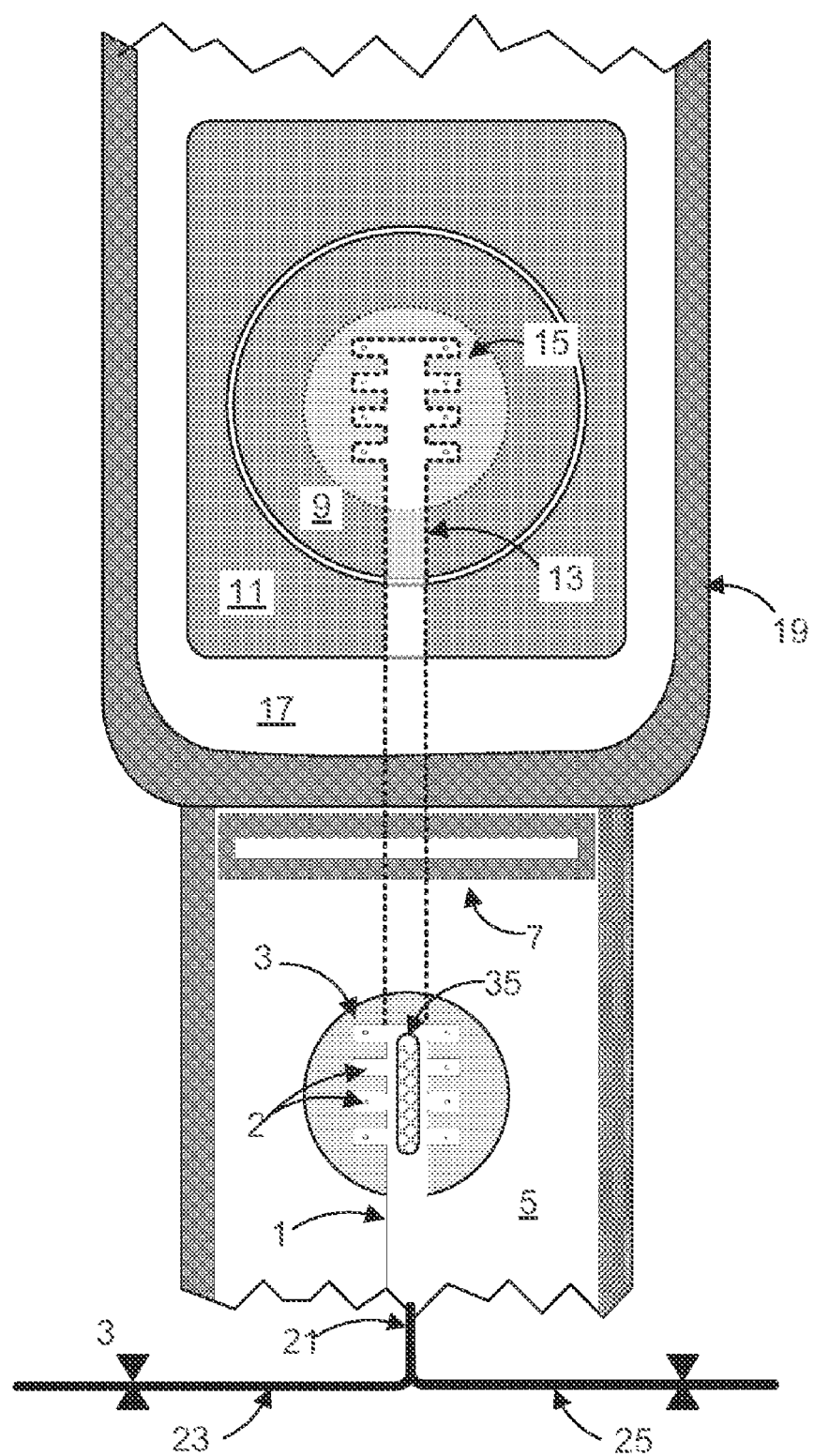
FIGS. 1A-B illustrates views of a preferred embodiment of this invention.

Preferred embodiments of the invention are now described. It should be understood that the preferred embodiment using Bernoulli wands are not limiting and other embodiments of this invention do not use Bernoulli wands. Headings are used herein for clarity only and without any intended limitation.

The words "significant" and "likely" (and similar words of degree) are used here to mean within acceptable and expected limits, usually commercially-acceptable limits. For example, in the phrase "significant wafer damage is unlikely in the process", the phrase "significant wafer damage" is taken to mean damage that limits or prevents intended, usually commercial, applications of the wafer. The phrase "unlikely in the process" is taken to mean that, although significant damage may occur, it occurs sufficiently rarely that commercial use of the process is not hindered or prevented. The ranges signified by these terms depend on commercial requirements (or research requirements, or the like) and can vary but in all cases are not to be construed, imposing requirements beyond what is currently achievable given a current state-of-the-art. It should be understood that this invention is not limited to commercial uses; intended uses include research uses, special purpose uses, and so forth.

Preferred embodiments of the apparatus of this invention utilize Bernoulli wands to transfer wafers according to transfer protocols to be described. Known transfer protocols generally take into account only the possibility of mechanical damage due to thermal stresses and do not consider the possibility of surface damage due to decomposition or sublimation. This limitation arises because Bernoulli wands have been primarily used to transfer elemental semiconductor wafers, e.g. silicon (Si) wafers. Such materials, of course, do not decompose, and also are not known to undergo significant sublimation at relevant process temperatures.

However, transfer protocols for compound semiconductor materials preferably take into account, not only the possibility of mechanical damage, but also the possibility of chemical surface damage. At higher temperatures, many compound semiconductors can release volatile species from their surfaces either by decomposition or by congruent or non-congruent sublimation ("surface changes"). It is of the utmost importance to preserve semiconductor surface quality, and therefore to limit or prevent such destructive surface changes. In this invention, this is achieved by providing an ambient environment containing an adequate supply of one or more chemical species ("active gases") that limit, prevent, or reverse the reactions leading to surface changes.

Gallium arsenide (GaAs) and gallium nitride (GaN) are two commercially important compound semiconductors known to undergo such surface changes. GaAs begins to decompose/sublime at approximately 640° C., and therefore above such temperature ranges, GaAs should be in an ambient containing an active gas, e.g., a gas comprising an active As compound (e.g. arsine, $AsH_3$). See, e.g., U.S. Pat. No. 5,659,188. For GaN, decomposition/sublimation begins at approximately 800° C., and therefore, it also should be in an ambient containing an active gas, e.g., a gas comprising an active N compound (e.g. ammonia, $NH_3$). See, e.g., Mastro et al. 2004, Journal of Crystal Growth 274, 38.

Active compounds can be either active at room temperature or inactive at room temperature but inactive compounds can be converted into active species at relevant decomposition/sublimation temperatures. In other words, active species may be present in inactive gases only over certain temperature ranges, or only above certain temperature ranges, or the like. Therefore, an active gas is preferably selected not only in view of the particular type of wafers to be transferred, but also in view of anticipated temperature ranges utilized during wafer transfer/residence. In the case of GaN, ammonia ($NH_3$) is commonly used during growth for the N source, since GaN growth is usually performed at temperatures above 1000° C. and $NH_3$ is already 15% decomposed by approximately 950° C. However, below about approximately 900-950° C., $NH_3$ may be not sufficiently decomposed to be an adequate source of active N species, and alternative active gases that decompose into active N species at lower temperatures are preferred for such lower temperature ranges. For example, dimethylhydrazine (DMHy) begins to pyrolytically decompose at approximately 320° C. and is completely decomposed at 800° C., and therefore can be a suitable active gas for temperature ranges below about 800-900° C. See Takizawa et al., 2007, Journal of Electronic Materials, 36 403. Also, hydrazine itself or compounds containing a pyrolytically-decomposable hydrazine moiety can also be suitable active gases at lower temperature ranges.

In further embodiments, gases can be made active by means other than heat, e.g., by producing plasmas that can be created in the flowing gases before entry into the transfer device, or in the transfer device itself, or in the vicinity of a substrate. Plasmas can be conventionally formed by RF electromagnetic fields generated by coils and the like.

In the case of GaN, it should further be noted that, although often grown in a hetero-epitaxial manner on sapphire substrates (m.p. greater than 2000° C.) which are stable at GaN growth temperatures, it is also often grown in a homo-epitaxial manner on substrates with a GaN surface (e.g. GaN freestanding or "pseudo-substrates"). Homo-epitaxial growth on freestanding or pseudo-substrates is known to result in higher quality materials, but the GaN substrate surface can be damaged during high temperature transfers. Therefore, such compound substrates are preferably protected by an active-gas Bernoulli wand (or other embodiment) of this invention to preserve substrate surface quality during transfer. Preserving surface quality is important as surface imperfections on the substrate formed during loading can lead to imperfection in an epilayer grown thereon. The preferred active gas Bernoulli wand embodiments of this invention, can accommodate low or high removal/replacement transfer temperatures, from as low as 250° C. up to as high as 900° C., as required or tolerated by different substrates.

Figure 1B:
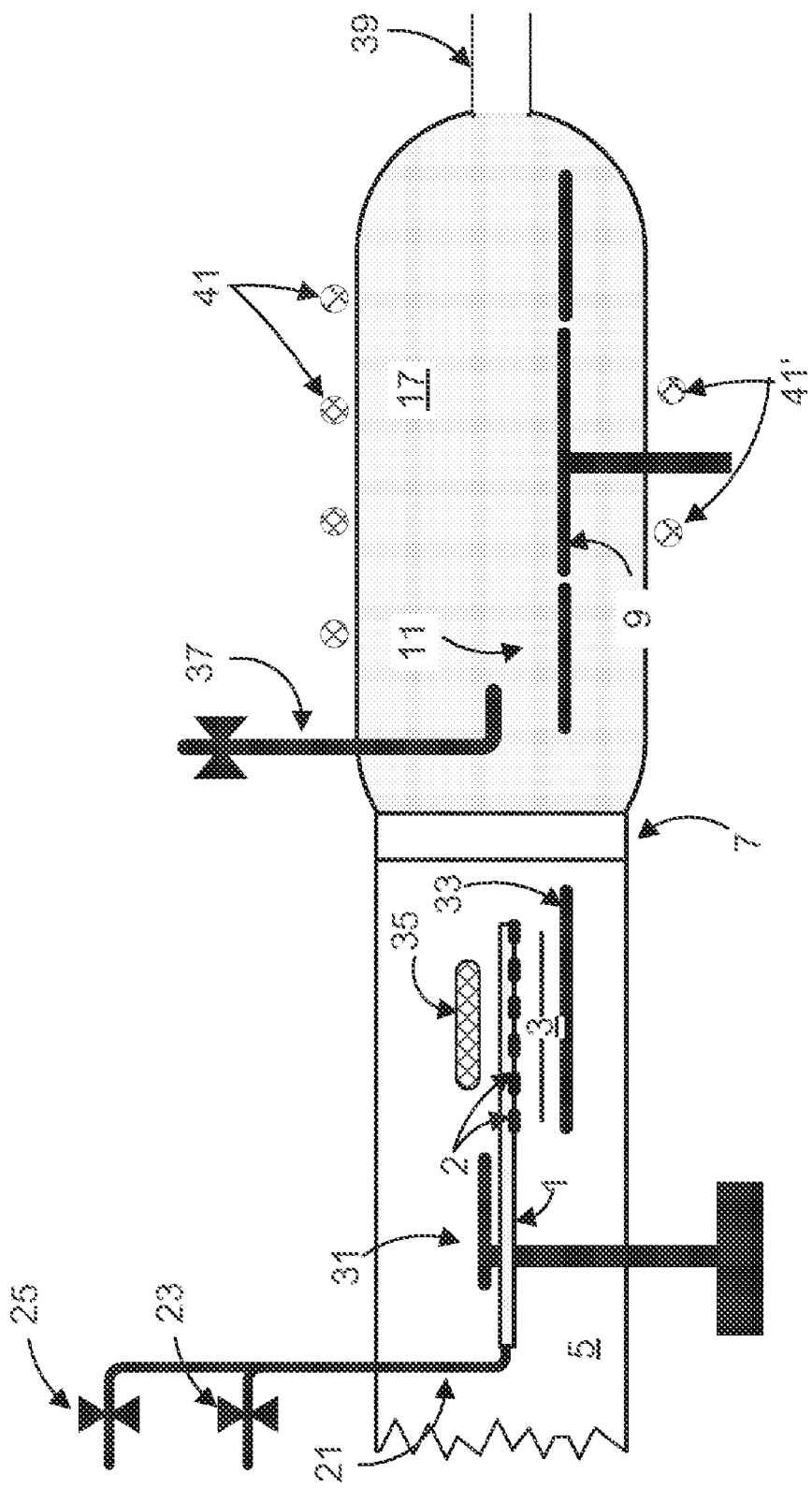

Turning now to apparatus of this invention, FIGS. 1A and 1B illustrate schematically a plan view and an elevation view, respectively, of a preferred Bernoulli-wand embodiment of apparatus of this invention. Since apparatus of this invention will find its usual application as a component of equipment designed for chemical vapor deposition ("CVD") processes, especially for commercial or high-volume equipment application of CVD processes, these figures illustrate a device of this invention in such an environment.

Considering first the environment of the illustrated transfer device of this invention, common features of exemplary CVD equipment include transfer chamber (or load chamber) 5 communicating to growth chamber 17 through isolation valve (or load lock) 7. Isolation valve 7 seals growth chamber 17, for example, when a CVD process is in progress, and opens to allow transfer device 1 to move freely into and out of the growth chamber. The isolation valve can be operated automatically or manually. A transfer chamber can include substrate support 33, which supports a substrate when within the transfer chamber, and robot arm 31 for moving the substrate transfer device 1 between the load chamber and the growth chamber. In other embodiments, transfer device 1 can be manually manipulated. Other components within the transfer chamber specifically related to the transfer device of this invention and are described subsequently.

Active gases can be reactive and hazardous. Thus portions of the equipment that can come into contract with the active gases are preferably of resistant materials, and locations where the active gases might be released are preferably equipped with abatement systems. In most embodiments of this invention, the transfer devices will release active gases into the growth chamber. Most known growth chambers are made of sufficiently resistant materials and are associated with adequate abatement systems. In many embodiments of this invention, the transfer device will also release at least some active gases into the transfer chamber. If the transfer chamber is not already made of resistant materials with an abatement system, it is preferably upgraded or redesigned with such features to be able to safely handle planned active gases.

A growth chamber 17 usually includes valved inlets 37 for fresh process gases and exhaust port 39 for spent process gases. During a CVD process, the substrates (or substrate) are supported by optional susceptor 9 which fits closely in an opening in shelf 11. This planar arrangement serves to promote desirable flow of process gases across the susceptor and limits undesirable gas flow below the susceptor. Components within the growth chamber, and the growth chamber itself, can be heated by a wide range of heating elements 41 (above the susceptor) and 41' (below the susceptor). These elements can include resistive elements, lamps radiating IR, visible, and UV lights, RF coils, and the like. For example, where the heating elements include lamps, the growth chamber preferably comprises materials at least partially transparent to radiation emitted by the lamps, e.g., quartz, and interior components preferably comprise materials at least partially radiation absorbent, e.g., SiC.

The illustrated embodiment is based on the Bernoulli effect, and possibly (but not necessarily) includes a known Bernoulli wand device or a modification thereof. Transfer device 1 comprises an elongated support which supports the device, one or more conduits for conducting one or more gases, and a plurality of ports 2 for releasing the gases in the vicinity of substrate 3. Conduits are not illustrated in FIG. 1A, but FIG. 1B illustrates a single conduit within the support leading to ports 2. FIG. 1B also illustrates that substrate 3 is being supported beneath the transfer device, above substrate support 33, and ready for transfer. The substrate is being suspended by the aerodynamic forces generated by gases flowing from ports 2. The support couples to a manual or automatic device for moving transfer device 1 between load chamber 5 and growth chamber 17. FIG. 1B illustrates the moving device as robot arm 31. FIG. 1A illustrates in solid outline the transfer device and substrate in position in transfer chamber 5 as device 1 and wafer 3, and also illustrates in dashed outline the transfer device and substrate in position in the growth chamber as transfer device 13 and wafer 15.

The transfer device can receive a single gas, e.g., an active gas such as $AsH_3$ or DMHy, from an external gas source; or can receive two gases, e.g., an active gas such as $AsH_3$ or DMHy and an inactive gas such as Ar, $N_2$, from two external gas sources; or can receive three or more gases, e.g., an active gas and two inactive gases, from three or more external gas sources; and so forth. Accordingly, a system with a transfer device of this invention can include supplies for one or more active gases and zero or more inactive gases. The exemplary embodiment is illustrated as receiving two gases: a first gas is supplied through valved connection 23; and a second gas is supplied through valved connection 25. If a transfer device comprises two or more conduits, the different gases can be coupled to the different conduits and carried to different pluralities of ports 2. In case the transfer device comprises only a single conduit, multiple gases are mixed before or in the device. Here, the different gases are to be coupled through component 21 that performs a plenum-like function in which mixing of the different gases occurs (so that gases of similar composition flow from the different output ports). The different coupling components illustrated in FIGS. 1A and 1B, can assume a variety of lengths and shapes.

Preferably, but optionally, the temperature of gases flowing through a transfer device can be controlled independently of the temperature of the surroundings, e.g., the temperature of the transfer chamber or the growth chamber. Such temperature control provides additional flexibility for ensuring wafer integrity. For example, a sufficiently high temperature can be reached in a transfer device so that potentially gases can be made active, e.g., $NH_3$ can be decomposed to active nitrogen species. Also, such temperature control can permit at least partially controlling the temperature of a suspended wafer. Thereby, a wafer can be removed at close to process temperature, and, within the transfer chamber, can be cooled at a rate selected to avoid physical damage while bathed in active gases to limit or prevent surface changes (e.g., decomposition or sublimation).

Gases flowing through a transfer device can be heated using heating elements associated with the transfer device that include (but are not limited to) heating lamps (with radiation emitted by either a filament or a solid state component), RF fields generated by, e.g., inductors, resistive heating elements and the like. FIGS. 1A and 1B schematically and generically illustrate heating element 35 associated with transfer device 1. This heating element 35 is illustrated as external to transfer device 1 and above the plane of the transfer device. For example, heating element 35 can be a lamp that directly heats the gases flowing in a transfer device or an inductor that indirectly heats the flowing gases by generating plasmas. In the case of lamps, part or all of the transfer device can comprise radiation absorbing materials, e.g., SiC. A heating element is illustrated in transfer chamber 5, since in most cases gases flowing in a transfer device when the device is within growth chamber 17 are adequately heated by the ambient temperatures of the growth chamber.

In other embodiments, heating elements associated with a transfer device can be physically linked to the device, e.g., external but attached to the transfer device or partially, or fully enclosed within the transfer device, or the like. For example, heating filaments can be within or attached to a transfer device. Current to heat the filaments can be supplied through external connections or induced by varying magnetic fields (i.e., the filaments act as transformed secondaries). Such elements are preferably configured to deliver most of their heat to the transfer device and avoid heating its environment.

Transfer devices can be fabricated of sufficiently resistant materials, e.g., quartz, SiN, BN, and the like, according to well known methods for machining, etching, bonding, and the like.

The present invention further provides methods and protocols employing the transfer devices of this invention for transferring wafers into and out of growth chambers at higher temperatures, even up to near growth temperatures in certain embodiments. Generally, substrates can be transferred between environments of different temperatures, either from a higher temperature environment to a lower temperature environment or from a lower temperature environment to a higher temperature environment. For example, substrates and wafers can be removed or replaced in a growth chamber (reactor chamber) at temperatures greater than about 600° C., or greater than about 700° C., or greater than about 850° C. or higher (but less than growth temperatures). With heated transfer devices, substrate and wafer temperatures can be ramped up and down in a transfer chamber (generally, the lower temperature environment) and not in the growth chamber (generally, the high temperature environment). Thus, longer times consumed by temperature ramps of the higher-thermal-mass growth chamber can be replaced by shorter times for temperature ramps of the lower-thermal-mass transfer device. More preferably, temperature rams of the growth chamber can be avoided altogether. Thereby, the growth chamber and the entire processing equipment can achieve higher wafer throughputs and higher system efficiencies.

Figures 2A, 2B:
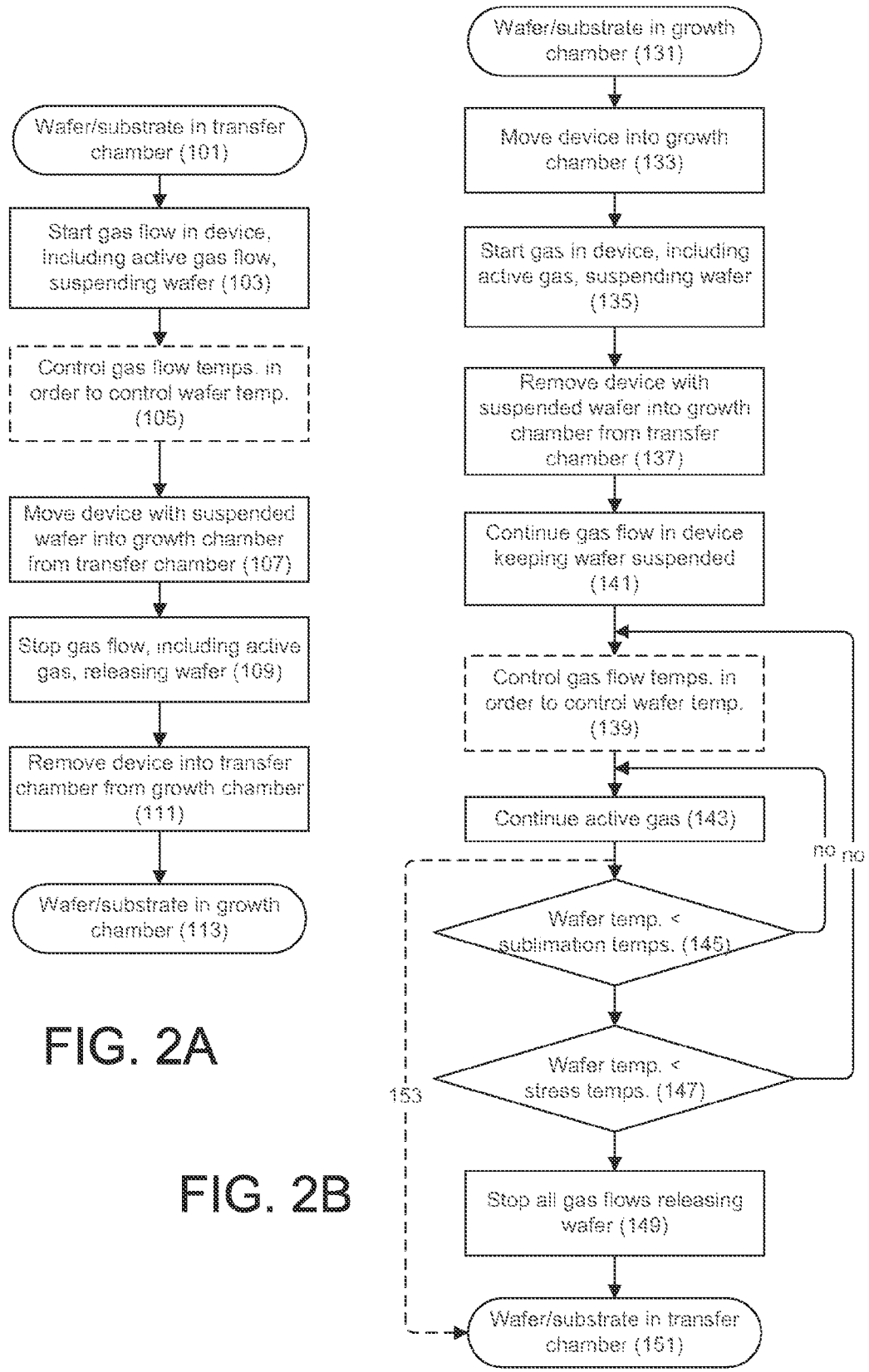
FIGS. 2A-B illustrates preferred embodiments of methods of this invention.

FIGS. 2A and 2B illustrate exemplary, basic methods and protocols for placing a wafer (or substrate) into a higher-temperature growth chamber, or for removing a wafer (or substrate) from a higher-temperature growth chamber, respectively. For clarity but without limitation, these figures (and FIG. 3) illustrate transfers between growth and transfer chambers using preferred transfer devices using gas flow to generate aerodynamic forces that suspend wafers. It will be understood that similar methods are useful to transfer between growth chambers and other than transfer chambers using other embodiments of transfer devices of this invention that use other forces to control substrates.

With reference to FIG. 2A, to transfer a wafer (or substrate) presently in a (typically, lower temperature) transfer chamber 101, first, the outlet ports of the transfer device are positioned above a wafer and gas flows are started 103 in the transfer device in order to pick up and suspend the wafer under the outlet ports of the transfer device. Optionally, but preferably, the temperature of the wafer is controlled (typically, increased) to temperature ranges sufficiently close to the (typically, higher temperature) growth-chamber temperature so that it can safely be moved into the growth chamber without likely damage due to thermal stress. The wafer temperature is controlled using heating elements associated with the transfer device which heat the transfer device and thereby heat the gases flowing within the device 105. The active gas flow can begin during step 103, or can begin during step 105 when the wafer temperature reaches a temperature near those at which surface changes occur. In any case, active gas flow begins before the transfer device is moved into the (typically, higher temperature) growth chamber.

Next, the transfer device with the suspended wafer is moved 107 into the growth chamber (after opening the isolation valve) and positioned so that the wafer is over the susceptor. Gas flows are then stopped 109 so that the wafer is released onto a susceptor in the chamber. Prior to stopping the gas flows, including the active gas flows, an equilibration time may optionally be preferable for the wafer to reach a temperature close to that of the susceptor (and for the chemical environment of the growth chamber to reaches growth conditions that will not cause surface changes to higher temperature substrates or wafers).

Finally, the transfer device is removed from the growth chamber 111 back into the transfer chamber (and the isolation valve is closed). The wafer or substrate is now in the growth chamber 113 ready for processing.

With reference to FIG. 2B, the method and protocol of removing a wafer or substrate presently in a growth chamber 131 into a transfer chamber (i.e., from typically higher-temperature environment to a typically lower-temperature environment) is, at least in initial steps, largely the reverse of the prior method and protocol. The transfer device is moved 133 from the transfer chamber into the growth chamber (after opening the isolation valve) and its outlet ports are positioned over the wafer; next, flows of gases, including the active gases, are started 135 to pick up and suspend the wafer; and next, the transfer device with the suspended wafer is removed 137 from the growth chamber (and the isolation valve closed). Gas flows are continued 139 so that the higher-temperature wafer remains suspended out of physical contact with the lower-temperature transfer chamber components, and active gas (optionally mixed with inert gas) flows are also continued so that surface changes due to the higher-temperature wafer are limited or prevented. If the transfer device has associated heating elements, these heat the transfer device and the gases flowing within the device so that the temperature of the wafer remains near the growth-chamber temperature to prevent thermal shock and damage.

Further protocol steps depend on whether the wafer is to be shortly replaced in the growth chamber for further processing, or whether the wafer is to be retained in the transfer chamber (e.g. processing is complete and the wafer is to be removed from the equipment). In the first case, the transfer device and gas flows remain unchanged 153 and continue to be heated so that the wafer is maintained at near growth-chamber temperatures. The wafer can alternatively be heated to such lower temperatures so that, upon transfer back into the higher-temperature growth chamber, significant thermal damage is unlikely. The wafer can then be moved back into the growth chamber according to, e.g., the process of FIG. 2A.

In the second case, the gas flow temperatures and the wafer temperature are decreased. Once the wafer temperature is below any sublimation (congruent and non-congruent) temperatures 145 and any decomposition temperatures, the active gas flow can optionally be stopped. The rate of temperature decrease is also controlled 147 so as not to thermally shock the wafer as this could result in cracking or even shattering of the wafer, especially if the substrate and growth material have significantly different thermal expansion coefficients. When the wafer temperature is sufficiently low, all gas flows can be stopped 149 and the wafer released onto a support in the transfer chamber. The wafer is now in the transfer chamber 151 at the typically lower transfer-chamber temperature.

Figure 3:
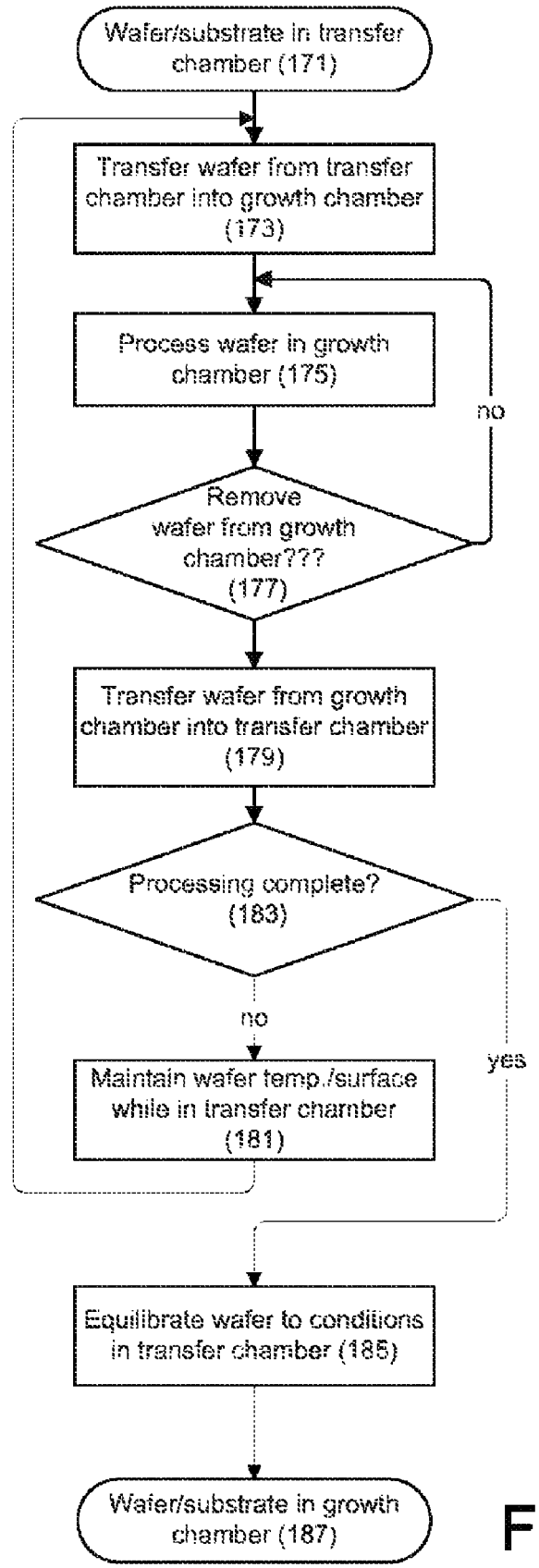
FIG. 3 illustrates another preferred embodiment of methods of this invention.

It can be appreciated that this invention permits wafers and substrates to be moved in and out of a growth chamber at higher temperatures (to lower-temperature environments) while maintaining surface quality and avoiding thermal damage. This invention is therefore particularly advantageous in processes during which a wafer is removed and replaced in the growth chamber multiple times. For example, during a long epitaxial growth process, a wafer may need to be removed from the growth chamber so that the growth chamber can be maintained (e.g., cleaned), precursor sources recharged, and so forth. FIG. 3 illustrates in more detail this advantageous application.

With reference to FIG. 3, the illustrated multiple-transfer protocol and method begins with a wafer or substrate in a transfer chamber 171 of semiconductor processing equipment, perhaps having just been placed in the processing equipment. Next, the wafer is transferred into the growth chamber 173, preferably using a transfer device of this invention and preferably according to the protocol and method of FIG. 2A or similar. As explained, the present invention allows the wafer to be moved from the lower-temperature transfer chamber into the growth chamber when the chamber is near or at process temperatures (up to maximum temperatures of about 850-1100° C.) without surface changes or thermal damages.

Next, the intended process 175 is performed on the wafer in the growth chamber. This will usually be epitaxial growth from gas-phase precursors of a material useful in semiconductor fabrication. Several such processes are known in the art to which this invention is applicable. During processing, removal of the wafer from the growth chamber may be useful or necessary. Such removal may be consequent to the demands of the process, e.g., to prepare for a next process step; state of the wafer, e.g., to allow stabilization at the lower temperature; and the state of the growth chamber and processing equipment generally, e.g., to permit cleaning or other maintenance. Accordingly, the decision whether or not to remove the wafer can be made 177. If removal is not necessary or preferred, processing 175 can continue.

If removal is necessary or preferred, then the wafer can be removed from the growth chamber 179 to the transfer chamber, preferably using a transfer device of this invention and according to the protocol and method of FIG. 2B or similar. The present invention allows the wafer to be moved into the lower-temperature transfer chamber when the growth chamber and wafer or substrate remains near or at process temperatures (up to maximum temperatures of about 850-1100° C.) without surface changes or thermal damages. Thereby, temperature ramp-down of the growth chamber can be limited or avoided.

As described with respect to FIG. 2B, subsequent steps of the removal protocol depend on whether or not the wafer is soon to be replaced in the growth chamber. Accordingly, the state of the wafer and process are ascertained and it is decided whether or not the processing of this wafer is complete 183.

If processing is complete, the transfer device equilibrates the wafer 185 to conditions in the transfer chamber by controllably lowering the temperature of the gas flows within the transfer device, and thus controllably lowering the temperature of the wafer, and also maintaining active gas flows as until the wafer temperature is sufficiently low in view of the ambient composition in the transfer chamber. If processing is not complete, the transfer device controllably controls gas flow temperatures so that the wafer 181 is maintained preferably near or at process temperature and continues flows of active gas in order to protect the surface of the wafer at these high temperatures. (The wafer can alternatively be heated to such lower temperatures so that, upon transfer back into the higher-temperature growth chamber, significant thermal damage is unlikely.) When the process can be resumed, the wafer is transferred into the growth chamber 173, preferably using a transfer device of this invention and according to the method and protocol of FIG. 2A or similar. Processing 175 begins again, e.g., when equipment maintenance or cleaning is complete.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A semiconductor wafer transfer device associated with semiconductor processing equipment that includes a first environment having a growth chamber for gas-phase epitaxial deposition and a second, lower temperature environment, the device comprising:

a support member;
a plurality of gas outlet ports in the support member for discharging gas;
at least one gas inlet port in the support member for receiving one or more gases from one or more external gas sources;
at least one passageway from the inlet port to the outlet ports having gas flowing within, the gas comprising an active portion that is chemically reactive with one or more semiconductor materials so as to limit decomposition or sublimation of a surface of a wafer comprising such materials; and
temperature control means to control the temperature of the transfer device and gases flowing therein;
wherein the temperature of the second environment is lower than the temperature of the first environment, and as the transfer device transfers the wafer from the growth chamber of the first environment to the second environment, the transfer device bathes with the gas until the wafer surface temperature falls below temperatures at which decomposition or sublimation of the wafer surface in the absence of the gas are significant.

2. The device of claim 1 further comprising a semiconductor wafer suspended beneath the transfer device by aerodynamic forces generated by gas discharged from the outlet ports onto the wafer and positioned so that the gas discharged from the outlet ports bathes at least a surface of the wafer, wherein the active gas becomes chemically reactive above a threshold temperature or in the presence of a plasma source.

3. The device of claim 2 wherein the active portion of the gas is chemically reactive with the surface material of the bathed wafer.

4. The device of claim 1 wherein the flowing gas comprises one or more of ammonia, hydrazine, dimethyl-hydrazine, a compound comprising a hydrazine moiety, phosphine and arsine.

5. The device of claim 1 wherein the flowing gas further comprises a chemically inactive carrier gas and the temperature control means include one or more heating elements sized and arranged to heat the transfer device, and thereby to heat gases flowing therein.

6. The device of claim 5, wherein the active portion of the gas results from at least partial pyrolytic decomposition above a threshold temperature, and wherein the heating elements are further sized and configured to heat the gas above the threshold temperature so as to cause such pyrolytic decomposition.

7. The device of claim 1 wherein the wafer surface comprises a group III nitride compound and wherein the active portion of the gas comprises nitrogen species, and wherein the threshold temperature is between approximately 320-1000° C.

8. The device of claim 1 further comprising a plasma source associated with the wafer transfer device, and wherein the active portion of the gas results from decomposition in the presence of the plasma source.

9. A method for transferring semiconductor wafers in a semiconductor processing equipment using the transfer device of claim 1, wherein a wafer is transferred between a first epitaxial growth environment where the wafer resides during periods of epitaxial growth and a second transfer environment where the wafer resides during other periods, the method comprising:
bathing a surface of a wafer with one or more gases from a plurality of gas outlet ports in the support member of the transfer device for a selected period of time, the gases comprising an active gas that is chemically reactive with the wafer surface so as to limit decomposition or sublimation of the surface, and then transferring the wafer from one of the first or second environments to the other;
wherein the wafer is initially present in the first environment and then is transferred from the first environment to the second environment; or
wherein the wafer is initially transferred from the first environment to the second environment;
wherein the wafer is bathed in the second environment, the temperature of the second environment is lower than the temperature of the first environment, and further comprising continuing to bath the wafer surface with the gas until the wafer surface temperature falls below temperatures at which decomposition or sublimation of the wafer surface in the absence of the gas are significant.

10. The method of claim 9 further comprising suspending the wafer by aerodynamic forces generated by the gases bathing the wafer surface and wherein the bathing and transferring steps are repeated one or more times.

11. The method of claim 9 further comprising heating the gas bathing the wafer surface so that the rate of wafer-surface temperature decrease is such that significant thermal damage to the wafer is unlikely.

12. A method for transferring semiconductor wafers in a semiconductor processing equipment, wherein the semiconductor processing equipment comprises a transfer device according to claim 1, wherein a wafer is transferred between a first epitaxial growth environment where the wafer resides during periods of epitaxial growth and a second transfer environment where the wafer resides during other periods, and wherein the temperature of the epitaxial growth environment is higher than the temperature of the transfer environment, the method comprising:
providing a wafer in the transfer environment;
suspending the wafer beneath the transfer device in the transfer environment by flowing onto a surface of a wafer one or more gases from the plurality of gas outlet ports in the support member of the transfer device, the gases comprising an active portion that is chemically reactive with the wafer surface so as to limit decomposition or sublimation of the surface;
controlling the temperature of the suspended wafer towards the higher temperature of the epitaxial growth environment by heating the transfer device and the gases flowing within the device by means of the heating elements of the transfer device, wherein the temperature is controlled so that the rate of wafer-surface temperature increase is such that significant thermal damage to the wafer is unlikely;
transferring the suspended wafer from the transfer environment to the epitaxial growth environment; and
depositing the wafer in the epitaxial growth environment by ceasing the flow of gases bathing the wafer.

13. The method of claim 12 wherein the active portion of the gas results from at least partial pyrolytic decomposition above a threshold temperature, and further comprising heating the gases flowing within the device by means of the heating elements to above the threshold temperature so as to cause such pyrolytic decomposition.

14. The method of claim 12 further comprising continuing to bath the wafer surface with the gases in the epitaxial growth environment until significant decomposition or sublimation of the wafer surface in the absence of the gas is unlikely.

15. A method for transferring semiconductor wafers in a semiconductor processing equipment, wherein the semiconductor processing equipment comprises a transfer device according to claim 1, wherein a wafer is transferred between a first epitaxial growth environment where the wafer resides during periods of epitaxial growth and a second transfer environment where the wafer resides during other periods, and wherein the temperature of the epitaxial growth environment is higher than the temperature of the transfer environment, the method comprising:

provideing a wafer in the epitaxial growth environment;

heating the transfer device and the one or more gases flowing within the device towards the higher temperature of the epitaxial growth environment by means of the heating elements of the transfer device, the gases comprising an active portion that is chemically reactive with the wafer surface so as to limit decomposition or sublimation of a surface of a suspended wafer;

suspending the wafer beneath the transfer device wafer in the epitaxial growth environment by flowing the gases onto a surface of the wafer from the plurality of gas outlet ports in the support member of the transfer device; and transferring the suspended wafer from the epitaxial growth environment to the transfer environment while preventing significant decomposition or sublimation of the wafer surface.

16. The method of claim 15 wherein the active portion of the gas results from at least partial pyrolytic decomposition above a threshold temperature, and further comprising heating the gases flowing within the device by means of the heating elements to above the threshold temperature so as to cause such pyrolytic decomposition.

17. The method of claim 15 further comprising:

controlling the temperature of the suspended wafer towards the lower temperature of the transfer environment by decreasing the heating of the transfer device at a rate such that significant thermal damage to the wafer is unlikely; and depositing the wafer in the transfer environment by ceasing the flow of gases bathing the wafer.

18. The method of claim 17 further comprising continuing to bath the wafer surface in the transfer environment with the gases until the wafer surface temperature falls below temperatures at which decomposition or sublimation of the wafer surface in the absence of the gases are significant.

19. The method of claim 15 further comprising:

maintaining the temperature of the suspended wafer towards the higher temperature of the epitaxial growth environment by continuing to heat the transfer device and the gases flowing within by means of the heating elements of the transfer device;

continuing to flow the gases onto a surface of a wafer in the transfer environment so as to prevent significant decomposition or sublimation of the wafer surface;

transferring the suspended wafer from the transfer environment back to the epitaxial growth environment; and depositing the wafer in the epitaxial growth environment by ceasing the flow of gases bathing the wafer.

20. The method of claim 15 further comprising continuing to bath the wafer surface with the gas until the wafer surface temperatures are such that significant thermal damage to the wafer is unlikely in the second environment.

* * * * *

UNITED STATES PATENT AND TRADEMARK OFFICE
CERTIFICATE OF CORRECTION

PATENT NO. : 8,153,536 B2  
APPLICATION NO. : 12/678466  
DATED : April 10, 2012  
INVENTOR(S) : Tischler et al.

Page 1 of 1

It is certified that error appears in the above-identified patent and that said Letters Patent is hereby corrected as shown below:

Title Page:
Item (56) References Cited, FOREIGN PATENT DOCUMENTS, change "JP 2005-340552 A" to -- JP 2005-340522 A --.

Signed and Sealed this
Twenty-eighth Day of August, 2012

David J. Kappos
*Director of the United States Patent and Trademark Office*